(12) United States Patent
Nakajima et al.

(10) Patent No.: US 8,728,711 B2
(45) Date of Patent: May 20, 2014

(54) CLEANING RETICLE, METHOD FOR CLEANING RETICLE STAGE, AND METHOD FOR MANUFACTURING SEMICONDUCTOR DEVICE

(75) Inventors: Yumi Nakajima, Tokyo (JP); Suigen Kyoh, Kanagawa-ken (JP); Ryoichi Inanami, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 419 days.

(21) Appl. No.: 12/971,468

(22) Filed: Dec. 17, 2010

(65) Prior Publication Data
US 2011/0159440 A1    Jun. 30, 2011

(30) Foreign Application Priority Data
Dec. 25, 2009  (JP) .................. 2009-293859

(51) Int. Cl.
G03F 7/20  (2006.01)
(52) U.S. Cl.
USPC ............................................. 430/311
(58) Field of Classification Search
USPC ................... 430/311; 355/30; 134/6
See application file for complete search history.

(56) References Cited

U.S. PATENT DOCUMENTS

2003/0148904 A1*  8/2003  Moore ................... 510/201
2006/0012060 A1*  1/2006  Hasei ..................... 264/1.38
2006/0162739 A1*  7/2006  Sogard .................... 134/1

FOREIGN PATENT DOCUMENTS

| JP | 2002-299228 | 10/2002 |
|---|---|---|
| JP | 2003-142370 | * 5/2003 |
| JP | 2004-327485 | 11/2004 |
| JP | 2005-353926 | 12/2005 |
| JP | 2006-13308 | 1/2006 |
| JP | 2006-229122 | 8/2006 |
| JP | 2007-165699 | 6/2007 |
| JP | 2008-292564 | * 12/2008 |

OTHER PUBLICATIONS

English translation of JP Publication 2008-292564, Dec. 2008.*
English translation JP Publication 2003-142370, May 2003.*
Notification of Comments issued by the Korean Patent Office on Jan. 16, 2012, for Korean Patent Application No. 10-2010-134586, and English-language translation thereof.
Decision of Refusal issued by the Korean Patent Office on Aug. 29, 2012, for Korean Patent Application No. 10-2010-134586, and English-language translation thereof.
Notification of Reason(s) for Refusal issued by the Japanese Patent Office on Feb. 18, 2013, for Japanese Patent Application No. 2009-293859, and English-language translation thereof.
Notification of the Examination Opinion issued by the Taiwanese Patent Office on Jun. 28, 2013 for Taiwanese Patent Application No. 099140610, and English-language translation thereof (12 total pages).

* cited by examiner

*Primary Examiner* — Brittany Raymond
(74) *Attorney, Agent, or Firm* — Finnegan, Henderson, Farabow, Garrett & Dunner, L.L.P.

(57) ABSTRACT

In one embodiment, a method for cleaning a reticle stage of an extreme ultraviolet exposure apparatus is disclosed. The method can include pressing a particle catching layer of a cleaning reticle onto the reticle stage, and the cleaning reticle includes the particle catching layer formed on a substrate. The method can include peeling the cleaning reticle from the reticle stage. The method can include removing the particle catching layer from the substrate. I addition, the method can include forming a new particle catching layer on the substrate having the particle catching layer removed.

8 Claims, 9 Drawing Sheets

CLEANING RETICLE, METHOD FOR CLEANING RETICLE STAGE, AND METHOD FOR MANUFACTURING SEMICONDUCTOR DEVICE

CROSS-REFERENCE TO RELATED APPLICATIONS

This application is based upon and claims the benefit of priority from the prior Japanese Patent Application No. 2009-293859 filed on Dec. 25, 2009; the entire contents of which are incorporated herein by reference.

FIELD

Embodiments described herein relate generally to a cleaning reticle, a method for cleaning reticle stage and a method for manufacturing a semiconductor device.

BACKGROUND

The line widths of circuit patterns are being reduced more and more due to the downscaling of semiconductor devices. The wavelengths of the exposure light of lithography technology used to expose resist films are being shortened to respond to the need for such reductions. So-called extreme ultraviolet (EUV) exposure light in wavelength regions around 13.5 nm is being investigated for use in generations having pattern widths of 30 nm or less. It is thought that EUV light will enable reductions of the pattern width and the pattern pitch not achievable conventionally.

Because EUV light attenuates rapidly in the atmosphere, the entire EUV optical path must be in a vacuum atmosphere. Therefore, the entire exposure unit including the EUV light source, the reticle stage holding the reticle, the optical system, the wafer stage holding the wafer to be exposed, and the like is disposed inside the vacuum chamber. In such a case, an electrostatic chuck is used because a vacuum chuck cannot be used by the reticle stage to hold the reticle. In other words, the entire back face of the reticle is held by and electrostatic charge of the chuck surface of the reticle stage (for example, refer to JP-A 2002-299228 (Kokai)).

Ultra-fine recesses/protrusions are formed in the electrostatic chuck surface of the reticle stage. In the case where such a reticle stage is used repeatedly, protrusions of the ultra-fine recesses/protrusions wear and particles undesirably occur. In the case where particles exist on the electrostatic chuck surface of the reticle stage, the particles are interposed between the reticle stage and the back face of the reticle when a new reticle is mounted; and the reticle undesirably deflects. As a result, the flatness of the reticle front face decreases and errors such as focus shift occur. Further, particles that move around to the reticle front face become foreign objects interposed in the optical path; and defects are undesirably transferred onto the wafer. Therefore, in the case where particles occur on the chuck surface of the reticle stage, it is necessary to clean the reticle stage promptly.

However, because the exposure unit including the reticle stage is disposed inside the vacuum chamber as described above, the interior of the vacuum chamber must be opened to the atmosphere to clean the reticle stage. Once the interior of the vacuum chamber is opened to the atmosphere, about half a day to a whole day is necessary to increase the degree of vacuum enough to start exposing again. Meanwhile, the exposure processing is stopped. As a result, the substantial operation time of the exposure apparatus is shortened; and the throughput of the semiconductor device undesirably decreases.

DETAILED DESCRIPTION

Figure 1A:
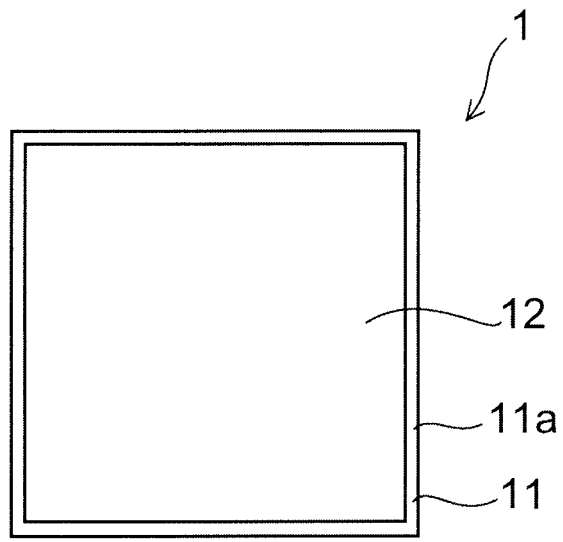
FIG. 1A is a rear view illustrating a cleaning reticle according to a first embodiment of the invention.

In general, according to one embodiment, a cleaning reticle of a reticle stage includes a substrate and an ultraviolet-curing layer. The substrate transmits ultraviolet rays, an ultraviolet-curing layer is formed on the substrate, and the ultraviolet-curing layer cures when irradiated with the ultraviolet rays.

In general, according to one embodiment, a cleaning reticle of a reticle stage includes a substrate and an extreme ultraviolet-curing layer. The substrate transmits extreme ultraviolet rays, an extreme ultraviolet-curing layer is formed on the substrate, and the extreme ultraviolet-curing layer cures when irradiated with the extreme ultraviolet rays.

In general, according to one embodiment, a method for cleaning a reticle stage of an extreme ultraviolet exposure apparatus is disclosed. The method can include pressing a particle catching layer of a cleaning reticle onto the reticle stage, and the cleaning reticle includes the particle catching layer formed on a substrate. The method can include peeling the cleaning reticle from the reticle stage. The method can include removing the particle catching layer from the substrate. In addition, the method can include forming a new particle catching layer on the substrate having the particle catching layer removed.

In general, according to one embodiment, a method for cleaning a reticle stage of an extreme ultraviolet exposure apparatus is disclosed. The method can include pressing an ultraviolet-curing layer of a cleaning reticle onto the reticle stage, the cleaning reticle includes the ultraviolet-curing layer formed on a substrate transmitting ultraviolet rays, and the ultraviolet-curing layer cures when irradiated with the ultraviolet rays. The method can include irradiating the ultraviolet rays onto the ultraviolet-curing layer via the substrate in a state of the ultraviolet-curing layer being pressed onto the reticle stage. In addition, the method can include peeling the cleaning reticle from the reticle stage.

In general, according to one embodiment, a method for cleaning a reticle stage of an extreme ultraviolet exposure apparatus is disclosed. The method can include pressing an extreme ultraviolet-curing layer of a cleaning reticle onto the reticle stage, the cleaning reticle includes the extreme ultraviolet-curing layer formed on a substrate transmitting extreme ultraviolet rays, and the extreme ultraviolet-curing layer cures when irradiated with the extreme ultraviolet rays. The method can include irradiating the extreme ultraviolet rays onto the extreme ultraviolet-curing layer via the substrate in a state of the extreme ultraviolet-curing layer being pressed onto the reticle stage. In addition, the method can include peeling the cleaning reticle from the reticle stage.

In general, according to one embodiment, a method for manufacturing a semiconductor device is disclosed. The method can include pressing a particle catching layer of a cleaning reticle onto a reticle stage of an extreme ultraviolet exposure apparatus, and the cleaning reticle includes the particle catching layer formed on a substrate. The method can include peeling the cleaning reticle from the reticle stage. The method can include mounting a reticle used for exposing to the reticle stage. The method can include exposing a resist film formed on a wafer by irradiating extreme ultraviolet rays onto the reticle mounted to the reticle stage. The method can include removing the particle catching layer from the substrate of the cleaning reticle after the peeling. In addition, the method can include forming a new particle catching layer on the substrate having the particle catching layer removed. The pressing, the peeling, the mounting, and the exposing are implemented in a continuous vacuum atmosphere.

In general, according to one embodiment, a method for manufacturing a semiconductor device is disclosed. The method can include pressing an ultraviolet-curing layer of a cleaning reticle onto a reticle stage of an extreme ultraviolet exposure apparatus, the cleaning reticle includes the ultraviolet-curing layer formed on a substrate transmitting ultraviolet rays, and the ultraviolet-curing layer cures when irradiated with the ultraviolet rays. The method can include irradiating the ultraviolet rays onto the ultraviolet-curing layer via the substrate in a state of the ultraviolet-curing layer being pressed onto the reticle stage. The method can include peeling the cleaning reticle from the reticle stage. The method can include mounting a reticle used for exposing to the reticle stage. In addition, the method can include exposing a resist film formed on a wafer by irradiating extreme ultraviolet rays onto the reticle mounted to the reticle stage. The pressing, the irradiating, the peeling, the mounting, and the exposing are implemented in a continuous vacuum atmosphere.

In general, according to one embodiment, a method for manufacturing a semiconductor device is disclosed. The method can include pressing an extreme ultraviolet-curing layer of a cleaning reticle onto a reticle stage of an extreme ultraviolet exposure apparatus, the cleaning reticle includes the extreme ultraviolet-curing layer formed on a substrate transmitting extreme ultraviolet rays, and the extreme ultraviolet-curing layer cures when irradiated with the extreme ultraviolet rays. The method can include irradiating the extreme ultraviolet rays onto the extreme ultraviolet-curing layer via the substrate in a state of the extreme ultraviolet-curing layer being pressed onto the reticle stage. The method can include peeling the cleaning reticle from the reticle stage. The method can include mounting a reticle used for exposing to the reticle stage. In addition, the method can include exposing a resist film formed on a wafer by irradiating extreme ultraviolet rays onto the reticle mounted to the reticle stage. The pressing, the irradiating, the peeling, the mounting, and the exposing are implemented in a continuous vacuum atmosphere.

Embodiments of the invention will now be described with reference to the drawings.

A first embodiment of the invention will now be described.

First, a cleaning reticle according to this embodiment will be described.

Figure 1B:
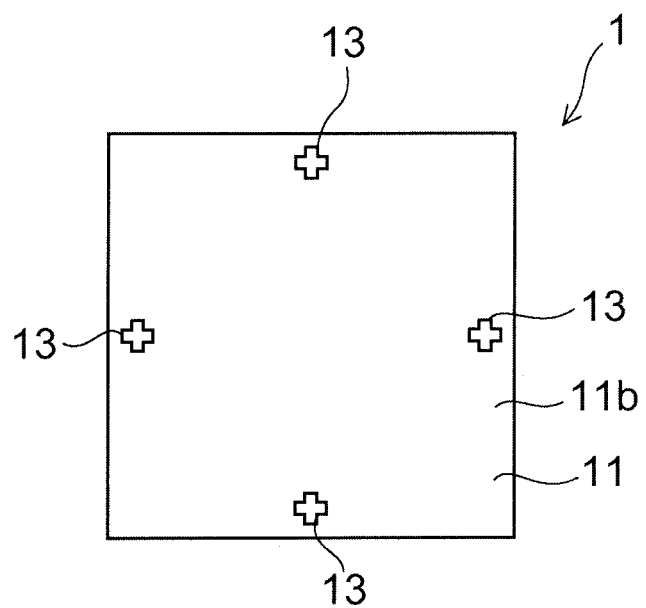
FIG. 1B is a front view thereof.
Figure 1C:
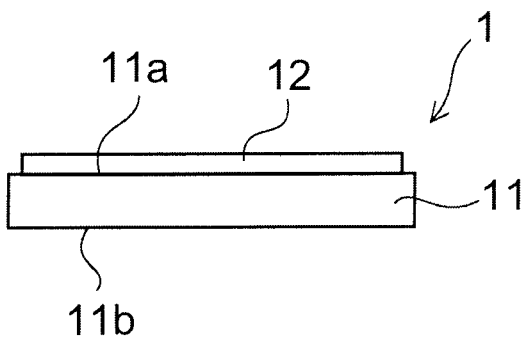
FIG. 1C is a side view thereof.

FIG. 1A is a rear view illustrating the cleaning reticle according to this embodiment; FIG. 1B is a front view thereof; and FIG. 1C is a side view thereof.

The cleaning reticle according to this embodiment is a dummy reticle for removing particles from a reticle stage of an EUV exposure apparatus. As illustrated in FIGS. 1A to 1C, a substrate 11 made of quartz is provided in a cleaning reticle 1 according to this embodiment. The substrate 11 is, for example, the same as a substrate of a normal reticle for exposure. An adhesive material layer 12 made of an adhesive material is provided on a region of a back face 11a of the substrate 11 excluding an end edge portion, that is, on substantially the entire surface of the back face 11a. The adhesive material layer 12 is a particle catching layer; and the adhesive material is, for example, a resin material. On the other hand, alignment marks 13 are formed, for example, in four locations on a front face 11b of the substrate 11. Although a chrome layer is provided as an electrostatic chuck on the back face of the quartz substrate in normal reticles used for EUV exposure, a chrome layer is not provided in the cleaning reticle according to this embodiment.

The method for cleaning the reticle stage according to this embodiment will now be described.

The cleaning of the reticle stage according to this embodiment is implemented using the cleaning reticle described above. Because the cleaning of the reticle stage is a portion of the operation of the EUV exposure apparatus and the operation of the EUV exposure apparatus is a portion of the manufacturing process of the semiconductor device, the following descriptions are in the order of the manufacturing processes of the semiconductor device.

Figure 2:
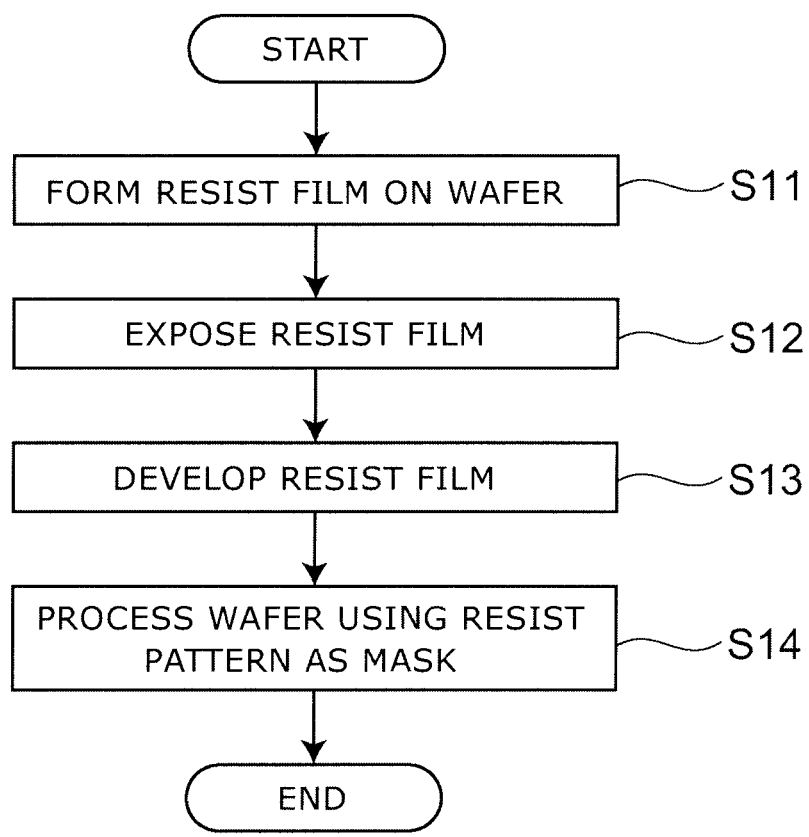
FIG. 2 is a flowchart illustrating a method for manufacturing the semiconductor device according to the first embodiment.

FIG. 2 is a flowchart illustrating the method for manufacturing the semiconductor device according to this embodiment.

Figure 3:
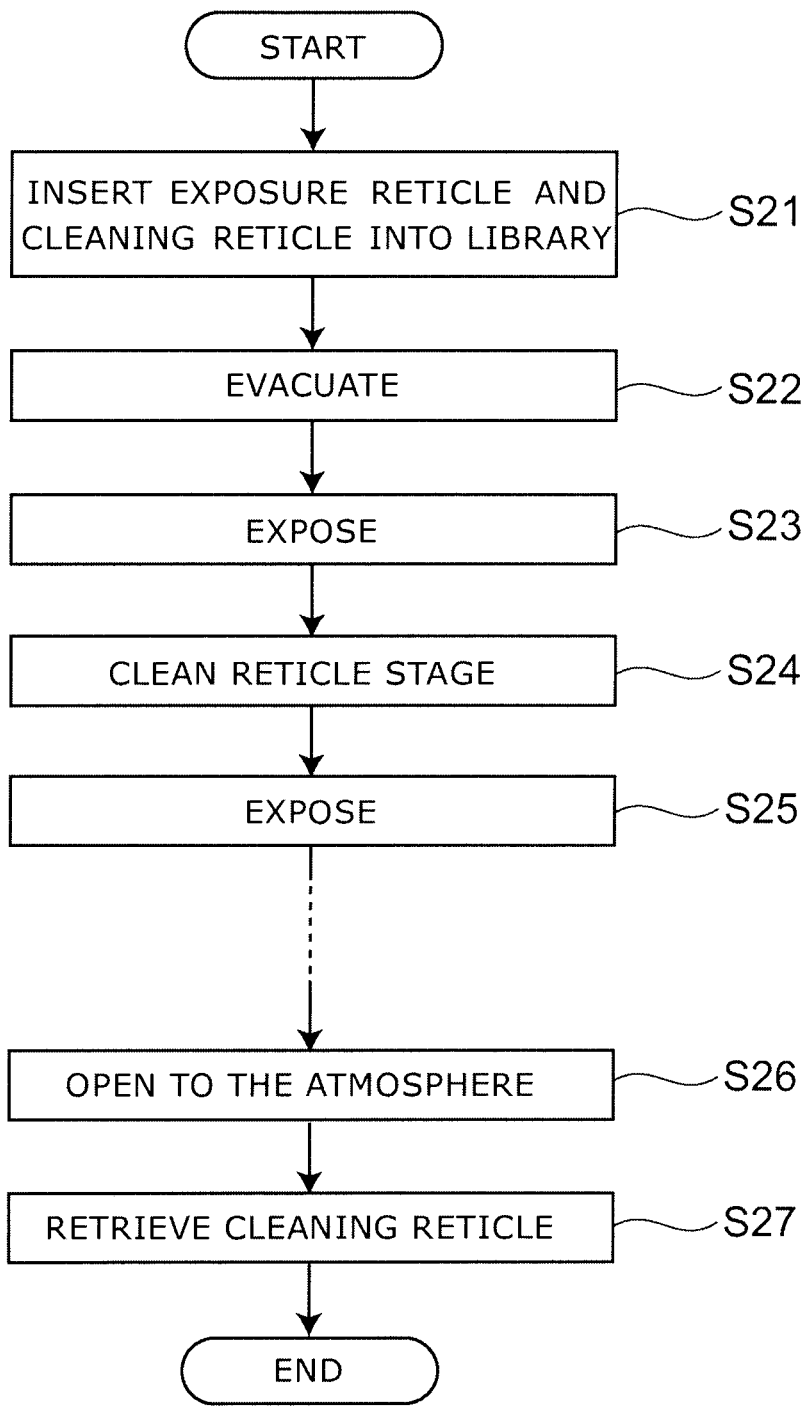
FIG. 3 is a flowchart illustrating a method for using the EUV exposure apparatus according to the first embodiment.

FIG. 3 is a flowchart illustrating a method for using the EUV exposure apparatus according to this embodiment.

Figure 4A:
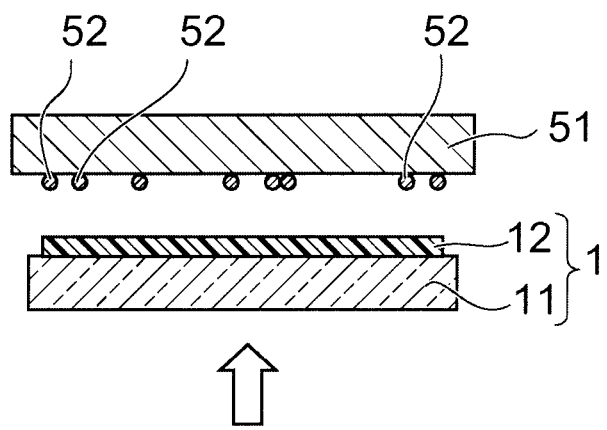
FIGS. 4A to 4C are cross-sectional views of processes, illustrating the method for cleaning the reticle stage according to the first embodiment.
Figure 4B:
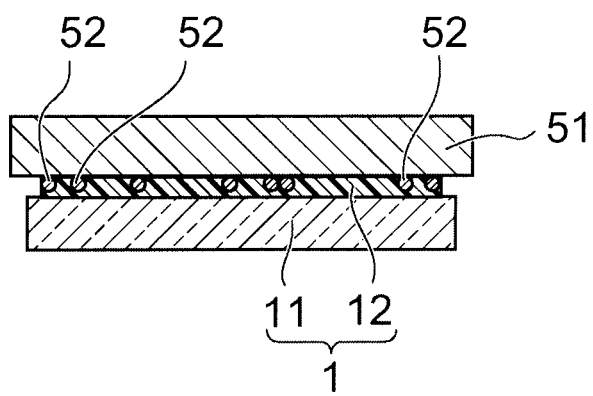
Figure 4C:
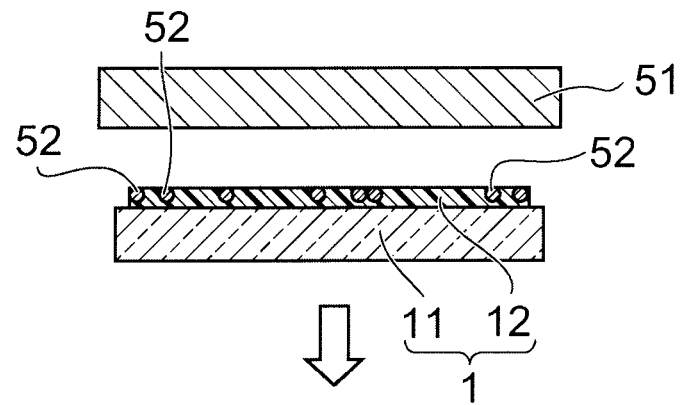

FIGS. 4A to 4C are cross-sectional views of processes, illustrating the method for cleaning the reticle stage according to this embodiment.

Figure 5:
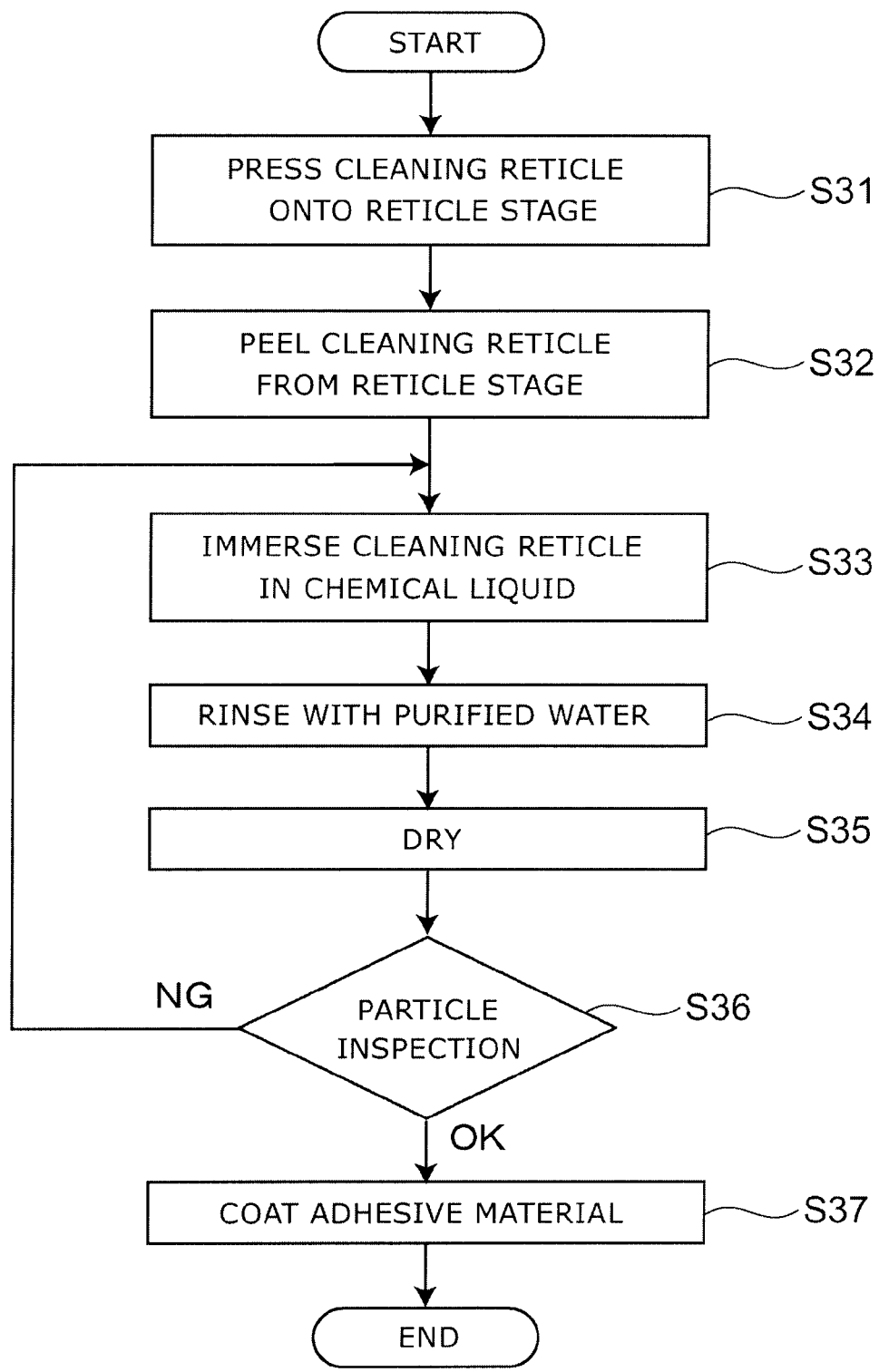
FIG. 5 is a flowchart illustrating the method for cleaning the reticle stage according to the first embodiment.

FIG. 5 is a flowchart illustrating the method for cleaning the reticle stage according to this embodiment.

FIG. 2 is a flowchart focusing on a wafer patterned to form a semiconductor device; FIG. 3 is a flowchart focusing on the EUV exposure apparatus; and FIG. 5 is a flowchart focusing on the cleaning reticle.

First, the method for manufacturing the semiconductor device according to this embodiment will be described.

As illustrated in step S11 of FIG. 2, a resist film is formed by coating a resist material on a wafer. Then, as illustrated in step S12, the EUV exposure apparatus is used to expose the resist film. At this time, EUV light having a wavelength of, for example, 13.5 nm is used as the exposure light. Thereby, an ultra-fine latent image can be formed in the resist film. Then, as illustrated in step S13, the resist film is developed after the exposure. Thereby, a portion of the resist film is selectively removed to form an ultra-fine resist pattern. Then, as illustrated in step S14, processing is implemented on the wafer using the resist pattern as a mask. For example, dry etching is performed using the resist pattern as a mask to pattern an insulating film formed on the wafer. Or, ion implantation is performed using the resist pattern as a mask to selectively form an impurity diffusion layer in the surface of the wafer.

A method for using the EUV exposure apparatus according to this embodiment will now be described.

An evacuation pump and a vacuum chamber are provided in the EUV exposure apparatus (not illustrated); and an exposure unit is contained in the interior of the vacuum chamber. The exposure unit includes: an EUV light source; an optical system that guides EUV light emitted from the EUV light source along a prescribed optical path; a reticle stage that holds a reticle at a position interposed in the optical path; a wafer stage that holds the wafer at a position to be irradiated with EUV light reflected by the reticle; and the like. An electrostatic chuck is provided in the reticle stage. A library that stores multiple reticles, an actuator that transfers the reticles between the library and the reticle stage, and the like also are provided in the vacuum chamber. By providing the library and the actuator, the reticle mounted to the reticle stage can be exchanged without breaking the vacuum. Further, in the EUV exposure apparatus, multiple wafers can be mounted sequentially to the wafer stage without breaking the vacuum.

First, as illustrated in step S21 of FIG. 3, a reticle used for normal exposure and the cleaning reticle described above are inserted into the library of the EUV exposure apparatus. Then, as illustrated in step S22, the vacuum chamber is closed; the evacuation pump is operated; and the interior of the vacuum chamber is brought to a vacuum atmosphere. For example, the degree of vacuum inside the vacuum chamber is about $1\times10^{-5}$ Pa ($=1\times10^{-7}$ Torr).

Then, as illustrated in step S23, the actuator removes the exposure reticle from the library and transfers the exposure reticle to a position opposing the reticle stage. Then, the electrostatic chuck of the reticle stage is operated to mount the reticle to the reticle stage. The wafer stage holds the wafer. The EUV light source emits EUV light (extreme ultraviolet rays) in such a state. Thereby, the EUV light emitted from the EUV light source is selectively reflected by the reticle and reaches the resist film formed on the wafer with a reduced diameter. As a result, the resist film is exposed. This exposure is the exposure illustrated in step S12 described above (referring to FIG. 2). When the exposure of one wafer is completed, the wafer held by the wafer stage is exchanged; and the exposure of the next wafer is performed. Thus, one exposure reticle is used to perform the exposure of multiple wafers. Then, when the exposure of the wafers of one lot is completed, the reticle mounted to the reticle stage is exchanged; and the exposure of the next lot is performed. Due to the exchange of the reticles, particles unavoidably occur on the reticle stage.

Therefore, as illustrated in step S24 of FIG. 3, the reticle stage is cleaned using the cleaning reticle 1 described above (referring to FIGS. 1A to 1C). Specifically, the actuator removes the exposure reticle from the reticle stage and returns it to the library. Then, as illustrated in FIG. 4A, the actuator removes the cleaning reticle 1 from the library and transfers the cleaning reticle 1 to a position opposing the reticle stage. At this time, the adhesive material layer 12 of the cleaning reticle 1 opposes a reticle stage 51. Particles 52 are adhered to the surface of the reticle stage 51.

Then, as illustrated in step S31 of FIG. 4B and FIG. 5, the actuator presses the cleaning reticle 1 onto the reticle stage 51 while performing positional alignment of the cleaning reticle 1 referring to the alignment marks 13. At this time, the adhesive material layer 12 is pressed onto the reticle stage 51. Thereby, the particles 52 occurring on the reticle stage 51 adhere to the adhesive material layer 12.

Then, as illustrated in step S32 of FIG. 4C and FIG. 5, the actuator peels the cleaning reticle 1 from the reticle stage 51. At this time, the particles 52 are peeled from the reticle stage 51 together with the cleaning reticle 1 because the particles 52 are adhered to the adhesive material layer 12 of the cleaning reticle 1. Thereby, the reticle stage 51 is cleaned by removing the particles 52 from the reticle stage 51. Then, the actuator returns the cleaning reticle 1 to the library.

Continuing as illustrated in step S25 of FIG. 3, a new exposure reticle is mounted to the reticle stage and exposure is performed. Because particles are not adhered to the reticle stage at this time, the reticle does not deflect due to particles; and particles do not move around to the front face of the reticle. As a result, exposure errors due to particles do not occur.

Subsequently, the exposure reticle is exchanged as necessary and the exposure is repeated. At this time, the reticle stage is cleaned as necessary similarly to step S24. The cleaning of the reticle stage may be performed, for example, every time the exposure reticle is exchanged, every prescribed number of times the exposure reticle is exchanged, or when the occurrence amount of the particles reaches a prescribed number. In such a case, multiple cleaning reticles may be inserted into the library and such cleaning reticles may be used sequentially; or one cleaning reticle may be used repeatedly a number of times.

Then, as illustrated in step S26, the evacuation pump is stopped; and the interior of the vacuum chamber is opened to the atmosphere.

Continuing as illustrated in step S27, the cleaning reticle is retrieved from the library of the EUV exposure apparatus. The exposed wafer is transferred to the next process which is the developing process (referring to step S13 of FIG. 2).

Subsequently, the used cleaning reticle is recycled.

As illustrated in FIG. 4C, the particles 52 adhere to or are taken into the adhesive material layer 12 of the used cleaning reticle 1. Therefore, as illustrated in step S33 of FIG. 5, the adhesive material layer 12 of the used cleaning reticle 1 is brought into contact with a chemical liquid. Specifically, the cleaning reticle 1 is immersed in a cleaning bath into which a chemical liquid, e.g., a mixed liquid of sulfuric acid and aqueous hydrogen peroxide, is poured. Thereby, the adhesive material layer 12 made of the resin material is dissolved in the chemical liquid; and the adhesive material layer 12 is removed from the substrate 11. At this time, the particles 52 adhered to the adhesive material layer 12 also are removed together with the adhesive material layer 12. On the other hand, the substrate 11 made of quartz does not dissolve in the chemical liquid.

Then, as illustrated in step S34, the substrate is removed from the cleaning bath and rinsed by purified water. Thereby, the chemical liquid is removed from the substrate.

Continuing as illustrated in step S35, the substrate is dried.

Then, as illustrated in step S36, it is inspected whether or not the particles remain on the back face of the substrate. In the case where the result of the inspection is NG, that is, the adhesive material or the particles remain on the back face of the substrate 11, the flow returns to step S33 and the substrate 11 is again immersed in the chemical liquid. On the other hand, if OK, that is, neither the adhesive material nor the particles are confirmed on the back face of the substrate 11, the flow proceeds to step S37.

In step S37, a new adhesive material layer 12 is formed on the back face 11a of the substrate 11 by coating an adhesive material. Thereby, a new cleaning reticle 1 is constructed in which the particles 52 are not adhered to the adhesive material layer 12. Such a cleaning reticle is inserted into the library of the EUV exposure apparatus and used to clean the reticle stage similarly to the cleaning reticle described above.

Operational effects of this embodiment will now be described.

According to this embodiment, the reticle stage can be cleaned without breaking the vacuum of the EUV exposure apparatus by inserting the cleaning reticle into the library of the EUV exposure apparatus. In other words, by inserting the cleaning reticle into the library in step S21 of FIG. 3 and evacuating the interior of the vacuum chamber in step S22, the transfer of the cleaning reticle between the library and the reticle stage and the pressing onto the reticle stage can be implemented using the actuator in the vacuum atmosphere. Therefore, the exposure in step S23, the cleaning of the reticle stage in step S24, and the exposure in step S25 can be implemented in a continuous vacuum atmosphere until the opening to the atmosphere in step S26. The cleaning process of step S24 includes the process of pressing the cleaning reticle onto the reticle stage in step S31 of FIG. 5 and the process of isolating the cleaning reticle from the reticle stage in step S32 of FIG. 5. Each of the exposure processes of steps S23 and S25 includes the process of mounting the exposure reticle to the reticle stage and the process of exposing the resist film with the EUV light. Thereby, it is unnecessary to open the interior of the vacuum chamber to the atmosphere and subsequently perform the evacuation every time the reticle stage is cleaned; and the substantial operation rate of the EUV exposure apparatus increases. As a result, the throughput of the semiconductor device increases.

Moreover, according to this embodiment, the reticle stage can be cleaned by merely inserting the cleaning reticle into the library of the EUV exposure apparatus in addition to the exposure reticle without improvements to the EUV exposure apparatus itself.

Further, according to this embodiment, the cleaning reticle can be reconstructed by bringing the cleaning reticle to which particles are adhered into contact with a chemical liquid, removing the particles from the substrate together with the adhesive material layer, and subsequently re-forming the adhesive material layer on the substrate. Thereby, the cost of the cleaning reticle can be suppressed because the expensive quartz substrate can be used repeatedly and it is unnecessary to re-form the alignment marks 13 (referring to FIG. 1B). Also, because the adhesive material layer is removed by dissolving in the chemical liquid, the adhesive material layer can be removed efficiently without partial residue of the adhesive material layer and damage to the substrate as compared to the case where the adhesive material layer is removed by mechanical means such as polishing.

Also, according to this embodiment, because the adhesive material layer is formed substantially on the entire back face of the substrate, the entire region of the surface of the reticle stage where the reticle is mounted can be cleaned by only one pressing of the cleaning reticle onto the reticle stage.

A second embodiment of the invention will now be described.

Figure 6A:
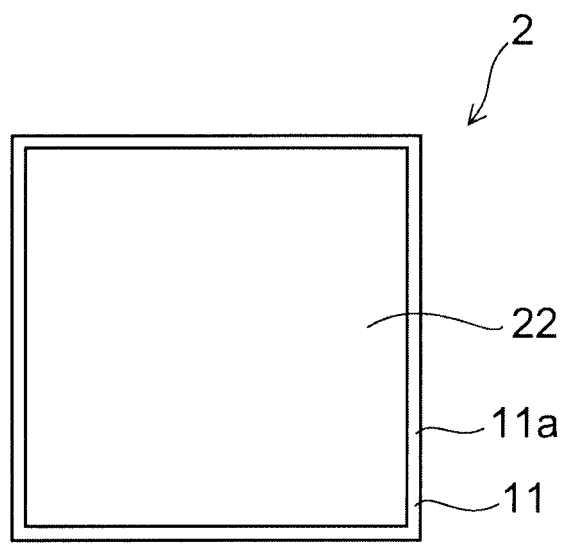
FIG. 6A is a rear view illustrating the cleaning reticle according to a second embodiment of the invention.
Figure 6B:
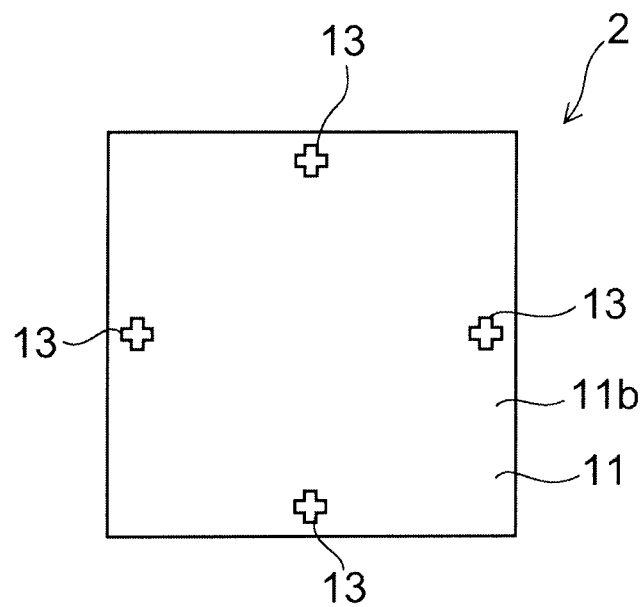
FIG. 6B is a front view thereof.

FIG. 6A is a rear view illustrating the cleaning reticle according to this embodiment; FIG. 6B is a front view thereof; and FIG. 6C is a side view thereof.

Figure 6C:
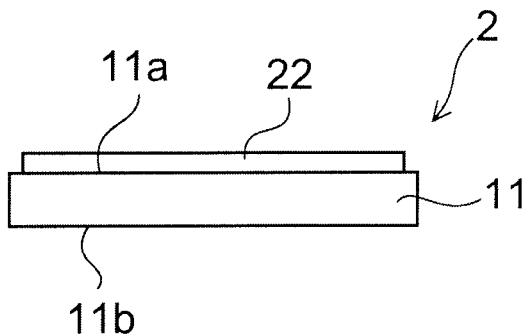
FIG. 6C is a side view thereof.

As illustrated in FIGS. 6A to 6C, the substrate 11 that transmits ultraviolet rays is provided in a cleaning reticle 2 according to this embodiment. The substrate 11 is, for example, a substrate made of quartz. An ultraviolet-curing layer 22 made of an ultraviolet-curing resin that cures when irradiated with ultraviolet rays is provided as the particle catching layer on substantially the entire surface of the back face 11a of the substrate 11, that is, on the region of the back face 11a excluding the end edges. The alignment marks 13 are formed on the front face 11b of the substrate 11.

The ultraviolet-curing layer 22 is in a semi-liquid state prior to the irradiation with the ultraviolet rays. The ultraviolet-curing resin may include, for example, a negative resist material for ultraviolet exposure or an ultraviolet-curing nanoimprint resin. Nanoimprint resins include, for example, nanoimprint resin PAK-01 of Toyo Gosei Co., Ltd.

In the specification, ultraviolet rays do not include extreme ultraviolet (EUV) rays. For example, ultraviolet rays are taken to have a wavelength region of 20 to 400 nm and extreme ultraviolet (EUV) rays are taken to have a wavelength region of 5 to 20 nm.

A method for cleaning the reticle stage according to this embodiment will now be described.

Figure 7:
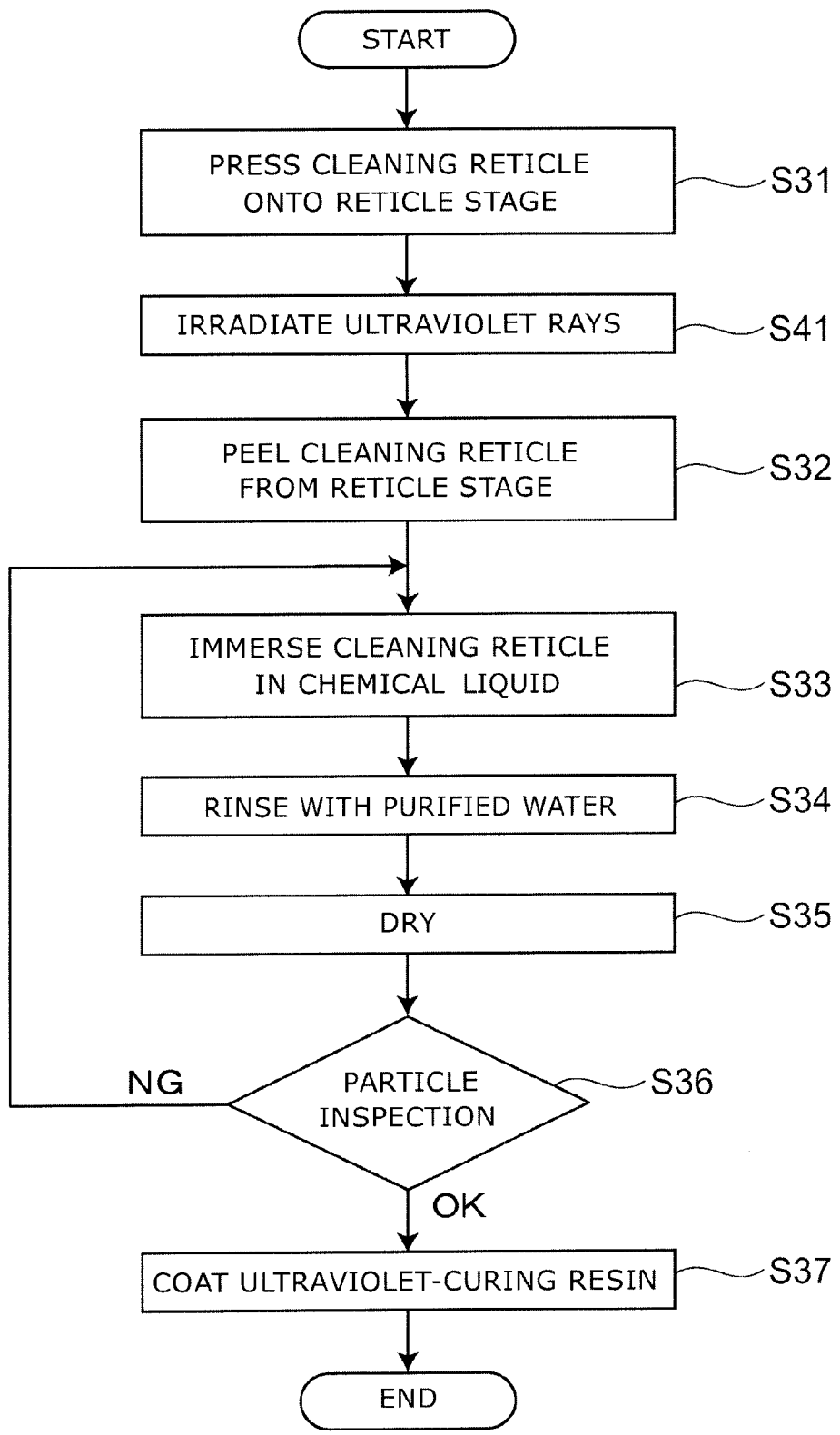
FIG. 7 is a flowchart illustrating the method for cleaning the reticle stage according to the second embodiment.

FIG. 7 is a flowchart illustrating the method for cleaning the reticle stage according to this embodiment.

Figure 8A:
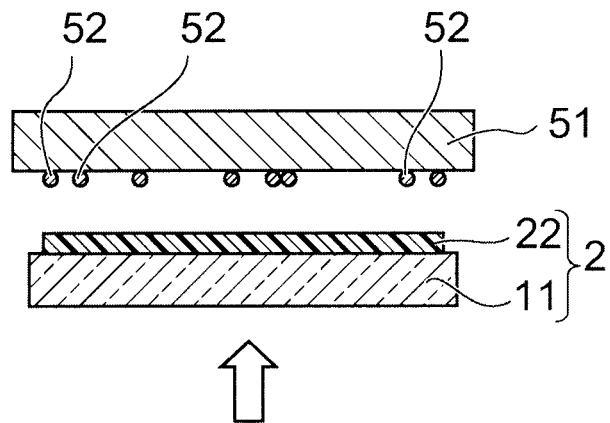
FIGS. 8A to 8C are cross-sectional views of processes, illustrating the method for cleaning the reticle stage according to the second embodiment.
Figure 8B:
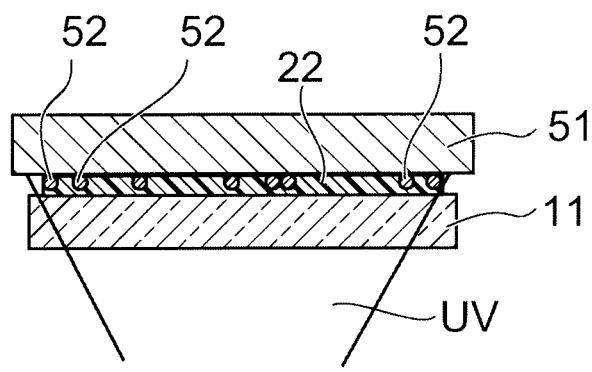
Figure 8C:
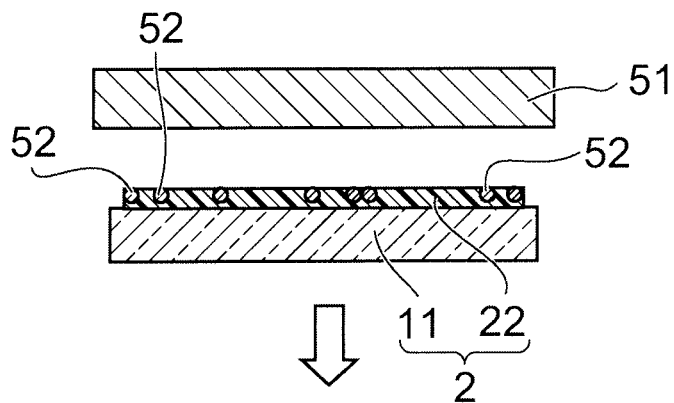

FIGS. 8A to 8C are cross-sectional views of processes, illustrating the method for cleaning the reticle stage according to this embodiment.

Figure 9:
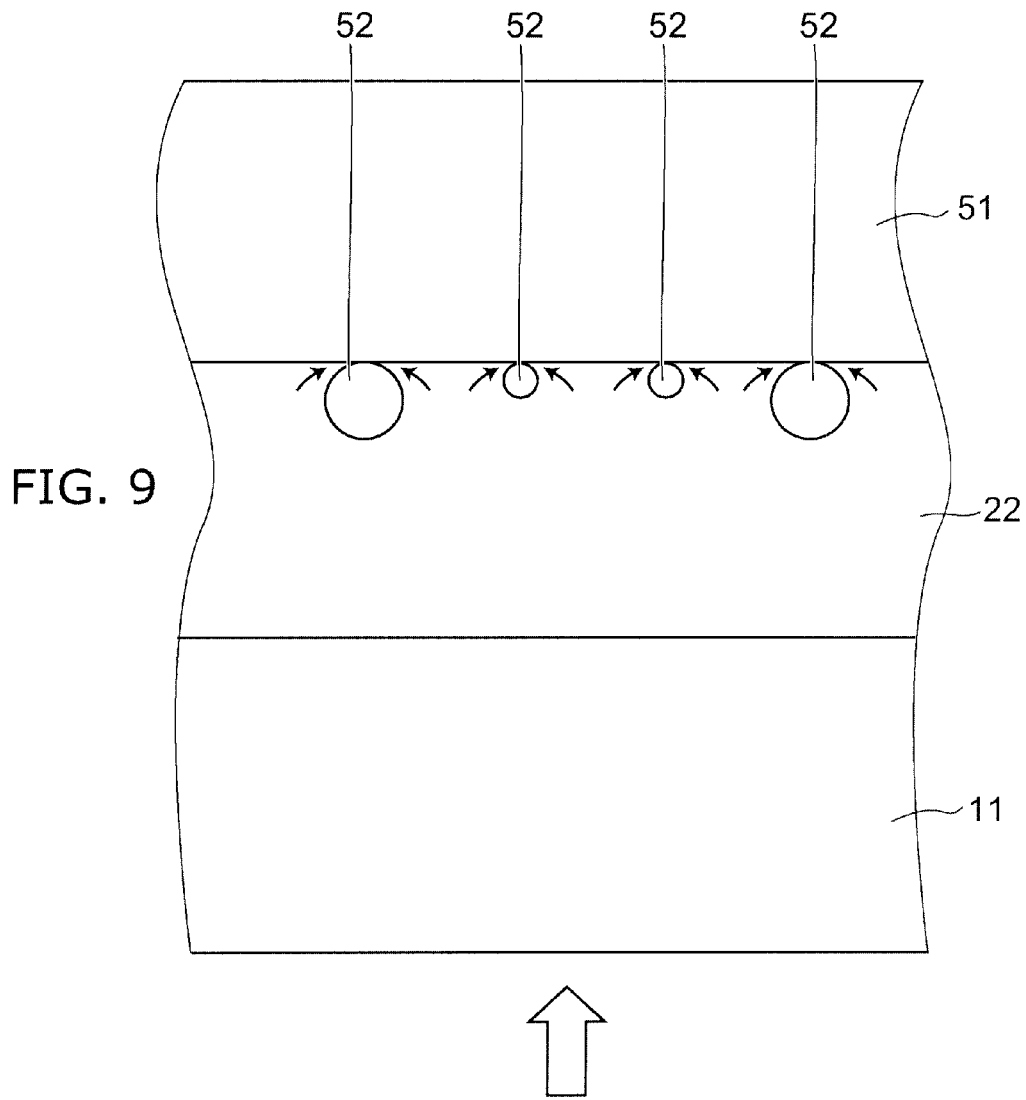
FIG. 9 is a cross-sectional view of a process, illustrating the ultraviolet-curing layer in the state of being pressed onto the reticle stage.

FIG. 9 is a cross-sectional view of a process, illustrating the ultraviolet-curing layer in the state of being pressed onto the reticle stage.

As illustrated in FIG. 7, the method for cleaning the reticle stage according to this embodiment differs from the cleaning method according to the first embodiment described above (referring to FIG. 5) in that a process of irradiating ultraviolet rays onto the ultraviolet-curing layer (step S41) is provided between the process of pressing the cleaning reticle onto the reticle stage (step S31) and the process of peeling the cleaning reticle from the reticle stage (step S32). An ultraviolet lamp (not illustrated) is provided in the EUV exposure apparatus used in this embodiment. The ultraviolet lamp is, for example, an ultraviolet lamp for cleaning a mirror provided in the optical system of the EUV exposure apparatus.

The method for cleaning the reticle stage according to this embodiment will now be described specifically.

As illustrated in step S31 of FIG. 7 and FIG. 8A, the actuator of the EUV exposure apparatus removes the cleaning reticle 2 from the library and transfers the cleaning reticle 2 to a position opposing the reticle stage 51. At this time, the ultraviolet-curing layer 22 of the cleaning reticle 2 opposes the reticle stage 51. The particles 52 are adhered to the surface of the reticle stage 51. Then, the actuator presses the cleaning reticle 2 onto the reticle stage 51. Thereby, the ultraviolet-curing layer 22 of the cleaning reticle 2 is pressed onto the reticle stage 51.

At this time, as illustrated in FIG. 9, the ultraviolet-curing resin moves around into the gap between the particles 52 and the reticle stage 51 because the ultraviolet-curing layer 22 is in a semi-liquid state. Thereby, the particles 52 are taken into the interior of the ultraviolet-curing layer 22. Because the ultraviolet-curing resin in the semi-liquid state also moves around small particles 52 between large particles 52, the small particles 52 between the large particles 52 also are taken into the ultraviolet-curing layer 22. To obtain such an effect, it is favorable for the thickness of the ultraviolet-curing layer 22 to be greater than the maximum size of the particles 52.

Then, as illustrated in step S41 of FIG. 7 and FIG. 8B, the ultraviolet lamp of the EUV exposure apparatus emits ultraviolet rays UV. The ultraviolet rays UV emitted from the ultraviolet lamp pass through the substrate 11 of the cleaning reticle 2 and are irradiated onto the ultraviolet-curing layer 22. Thereby, the ultraviolet-curing layer 22 cures in the state in which the particles 52 are taken into the ultraviolet-curing layer 22. At this time, the ultraviolet-curing layer 22 loses its bonding force to the reticle stage 51.

Continuing as illustrated in step S32 of FIG. 7 and FIG. 8C, the actuator peels the cleaning reticle 2 from the reticle stage 51. Thereby, the particles 52 taken into the ultraviolet-curing layer 22 also are removed from the reticle stage 51 together with the cleaning reticle 2. Subsequently, the actuator returns the cleaning reticle 2 to the library. The cleaning reticle 2 having the cured ultraviolet-curing layer 22 is not removed again from the library to be used to clean the reticle stage 51.

The method for cleaning the reticle stage and the method for manufacturing the semiconductor device except for the description of this embodiment recited above are similar to those of the first embodiment described above. In other words, the used cleaning reticle is retrieved after opening the vacuum chamber to the atmosphere and is immersed in a cleaning bath into which a chemical liquid, e.g., a mixed liquid of sulfuric acid and aqueous hydrogen peroxide, is poured. Thereby, the ultraviolet-curing layer 22, which is cured in the state in which the particles 52 have been taken in, is removed from the substrate 11. Subsequently, after cleaning the substrate 11 with water and drying, a new ultraviolet-curing layer 22 is formed by coating the ultraviolet-curing resin on the back face of the substrate 11. Thereby, the substrate 11 is recycled to construct the new cleaning reticle 2. In this embodiment as well, similarly to the first embodiment described above, the resist film formed on the wafer is exposed not with ultraviolet rays but with EUV light.

Operational effects of this embodiment will now be described.

The ultraviolet-curing layer 22 of this embodiment is in a semi-liquid state and has a low viscosity when pressed onto the reticle stage 51. Therefore, the particles 52 are quickly taken in. As illustrated in FIG. 9, because the ultraviolet-curing resin moves around between the particles 52 and the reticle stage 51, the particles 52 can be taken in reliably. Also, the ultraviolet-curing layer 22 can reliably take in and remove small particles 52 existing between large particles 52.

Further, because the ultraviolet-curing layer 22 loses its bonding force to the reticle stage 51 when cured, the cleaning reticle 2 can be peeled easily from the reticle stage 51. Also, because the ultraviolet-curing resin may include a negative resist for ultraviolet exposure or a similar material, the acquisition and handling of the ultraviolet-curing resin is easy; and the construction of the cleaning reticle 2 is easy. Because an ultraviolet lamp for mirror cleaning can be utilized as the light source of the ultraviolet rays for curing the ultraviolet-curing layer 22, the existing EUV exposure apparatus can be used as-is.

The operational effects of this embodiment other than those recited above are similar to those of the first embodiment described above. In other words, the throughput of the exposure processing is high because the reticle stage can be cleaned without breaking the vacuum. Also, costs necessary for cleaning the reticle stage are low because the substrate of the cleaning reticle can be recycled. Further, because the ultraviolet-curing layer is formed on substantially the entire back face of the substrate, the entire region of the reticle stage where the reticle is mounted can be cleaned with one operation.

A modification of this embodiment will now be described.

Figure 10:
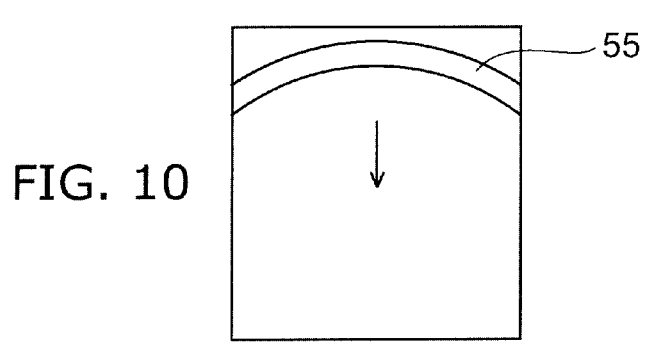
FIG. 10 illustrates a region irradiated with an EUV light used in a modification of the second embodiment.

FIG. 10 illustrates a region irradiated with an EUV light used in this modification.

The cleaning reticle according to this modification differs from the cleaning reticle 2 according to the second embodiment described above (referring to FIGS. 6A and 6B) in that an EUV-curing layer that cures when irradiated with EUV light is provided as the particle catching layer. The EUV-curing layer is formed of, for example, a negative resist for EUV exposure.

In this modification, the EUV-curing layer is cured in the process of step S41 of FIG. 7 by irradiating with the EUV light used to expose the resist film instead of ultraviolet rays. More specifically, as illustrated in FIG. 10, a slit-shaped EUV light irradiated region 55 emits EUV light while moving relative to the cleaning reticle pressed onto the reticle stage. The EUV light passes through the substrate of the cleaning reticle to reach the EUV-curing layer. Thereby, the entire EUV-curing layer is scanned to cure the entire EUV-curing layer.

According to this modification, because the EUV light used to expose the resist film can be used to cure the EUV-curing layer, applications are possible even in EUV exposure apparatuses in which an ultraviolet lamp is not provided. Otherwise, the configurations and operational effects of this modification are similar to those of the second embodiment described above.

According to the embodiments described above, a cleaning reticle that can clean the reticle stage without opening the exposure unit of the extreme ultraviolet exposure apparatus to the atmosphere, a method for cleaning the reticle stage, and a method for manufacturing a semiconductor device can be realized.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

The invention claimed is:

1. A method for cleaning a reticle stage of an extreme ultraviolet exposure apparatus, the method comprising:
    pressing a particle catching layer of a cleaning reticle onto the reticle stage, the cleaning reticle including the particle catching layer formed on a substrate;
    irradiating ultraviolet rays onto the particle catching layer via the substrate in a state of the particle catching layer being pressed onto the reticle stage, the substrate being a substrate transmitting the ultraviolet rays, the particle catching layer being formed of a material curing when irradiated with the ultraviolet rays;
    peeling the cleaning reticle from the reticle stage;
    removing the particle catching layer from the substrate; and
    forming a new particle catching layer on the substrate having the particle catching layer removed.

2. The method according to claim 1, wherein the removing of the particle catching layer includes dissolving the particle catching layer in a chemical liquid.

3. A method for cleaning a reticle stage of an extreme ultraviolet exposure apparatus, the method comprising:
    pressing a particle catching layer of a cleaning reticle onto the reticle stage, the cleaning reticle including the particle catching layer formed on a substrate;
    irradiating extreme ultraviolet rays onto the particle catching layer via the substrate in a state of the particle catching layer being pressed onto the reticle stage, the substrate being a substrate transmitting the extreme ultraviolet rays, the particle catching layer being formed of a material curing when irradiated with the extreme ultraviolet rays;

peeling the cleaning reticle from the reticle stage;

removing the particle catching layer from the substrate; and forming a new particle catching layer on the substrate having the particle catching layer removed.

4. The method according to claim 3, wherein the removing of the particle catching layer includes dissolving the particle catching layer in a chemical liquid.

5. A method for cleaning a reticle stage of an extreme ultraviolet exposure apparatus, the method comprising:

pressing an ultraviolet-curing layer of a cleaning reticle onto the reticle stage, the cleaning reticle including the ultraviolet-curing layer formed on a substrate transmitting ultraviolet rays, the ultraviolet-curing layer curing when irradiated with the ultraviolet rays;

irradiating the ultraviolet rays onto the ultraviolet-curing layer via the substrate in a state of the ultraviolet-curing layer being pressed onto the reticle stage; and peeling the cleaning reticle from the reticle stage.

6. A method for cleaning a reticle stage of an extreme ultraviolet exposure apparatus, the method comprising:

pressing an extreme ultraviolet-curing layer of a cleaning reticle onto the reticle stage, the cleaning reticle including the extreme ultraviolet-curing layer formed on a substrate transmitting extreme ultraviolet rays, the extreme ultraviolet-curing layer curing when irradiated with the extreme ultraviolet rays;

irradiating the extreme ultraviolet rays onto the extreme ultraviolet-curing layer via the substrate in a state of the extreme ultraviolet-curing layer being pressed onto the retide stage; and peeling the cleaning reticle from the reticle stage.

7. A method for manufacturing a semiconductor device, comprising:

pressing an ultraviolet-curing layer of a cleaning reticle onto a reticle stage of an extreme ultraviolet exposure apparatus, the cleaning reticle including the ultraviolet-curing layer formed on a substrate transmitting ultraviolet rays, the ultraviolet-curing layer curing when irradiated with the ultraviolet rays;

irradiating the ultraviolet rays onto the ultraviolet-curing layer via the substrate in a state of the ultraviolet-curing layer being pressed onto the reticle stage;

peeling the cleaning reticle from the reticle stage;

mounting a reticle used for exposing to the reticle stage; and exposing a resist film formed on a wafer by irradiating extreme ultraviolet rays onto the reticle mounted to the reticle stage, the pressing, the irradiating, the peeling, the mounting, and the exposing being implemented in a continuous vacuum atmosphere.

8. A method for manufacturing a semiconductor device, comprising:

pressing an extreme ultraviolet-curing layer of a cleaning reticle onto a reticle stage of an extreme ultraviolet exposure apparatus, the cleaning reticle including the extreme ultraviolet-curing layer formed on a substrate transmitting extreme ultraviolet rays, the extreme ultraviolet-curing layer curing when irradiated with the extreme ultraviolet rays;

irradiating the extreme ultraviolet rays onto the extreme ultraviolet-curing layer via the substrate in a state of the extreme ultraviolet-curing layer being pressed onto the reticle stage;

peeling the cleaning reticle from the reticle stage;

mounting a reticle used for exposing to the reticle stage; and exposing a resist film formed on a wafer by irradiating extreme ultraviolet rays onto the reticle mounted to the reticle stage, the pressing, the irradiating, the peeling, the mounting, and the exposing being implemented in a continuous vacuum atmosphere.

* * * * *